United States Patent
Fisher et al.

(10) Patent No.: US 7,683,384 B2
(45) Date of Patent: Mar. 23, 2010

(54) ULTRA-THIN ALPHANUMERIC DISPLAY

(75) Inventors: David Fisher, Doylestown, PA (US);
Philip Heft, Doylestown, PA (US);
Rocco Vetro, Quakertown, PA (US)

(73) Assignee: Nicomatic LP, Warminster, PA (US)

( * ) Notice: Subject to any disclaimer, the term of this patent is extended or adjusted under 35 U.S.C. 154(b) by 796 days.

(21) Appl. No.: 11/447,300

(22) Filed: Jun. 6, 2006

(65) Prior Publication Data
US 2006/0290374 A1 Dec. 28, 2006

Related U.S. Application Data
(60) Provisional application No. 60/688,096, filed on Jun. 7, 2005.

(51) Int. Cl.
*H01L 27/15* (2006.01)
(52) U.S. Cl. ............... 257/84; 257/88; 257/692; 257/723; 257/730; 257/E31.083
(58) Field of Classification Search .......... 257/690, 257/692, 700, 723, 83, 84, 88, 89
See application file for complete search history.

(56) References Cited

U.S. PATENT DOCUMENTS
6,137,224 A * 10/2000 Centofante ............ 313/510

2006/0220051 A1 * 10/2006 Fung et al. ............ 257/99

FOREIGN PATENT DOCUMENTS
| JP | 5-62748 | 3/1993 |
| JP | 8-137415 | 5/1996 |
| JP | 9-22259 | 1/1997 |

* cited by examiner

*Primary Examiner*—Wai-Sing Louie
(74) *Attorney, Agent, or Firm*—Drinker Biddle & Reath LLP

(57) ABSTRACT

An alphanumeric display includes a substrate that has top and bottom surfaces, a plurality of electrical contacts on the top surface, a plurality of light-emitting electronic devices mounted on the top surface, and a plurality of electrical pads on the bottom surface. The electrical contacts are connected to at least one light-emitting electronic device, and each of the light-emitting electronic devices is electrically connected with corresponding ones of the electrical contacts. The electrical pads are electrically connected to corresponding ones of the electrical contacts for communicating to the light-emitting electronic devices external sources of electrical power and control signals. The electrical pads on the bottom surface are arranged in a pattern to facilitate connections to the device using a conductive adhesive.

2 Claims, 9 Drawing Sheets

ULTRA-THIN ALPHANUMERIC DISPLAY

This application claims the benefit of the earlier filing date under 35 U.S.C. §119 of U.S. Provisional Patent Application No. 60/688,096, filed on 7 Jun. 2005, the disclosure of which is incorporated by reference herein in its entirety.

FIELD OF THE INVENTION

The invention relates to alphanumeric displays, particularly but not limited to ultra-thin alphanumeric light emitting diode (LED) displays for membrane switch applications.

BACKGROUND OF THE INVENTION

Alphanumeric displays, such as widely used seven- or eight-segment displays, are typically about 3.5 mm thick and have ten or more leads extending from along the edges of the display for attachment to a printed circuit board (PCB.) Typical displays comprise a substrate with seven or more LEDs attached. A molded lens is then added to diffuse the light from the LEDs and define the segments. The lens typically makes up the majority of the thickness of the display.

Typical alphanumeric displays are designed for use with PCBs. However, they are also used in the membrane switch industry, where they must be attached to circuits made by printing conductive inks onto polyester.

A membrane switch is an electrical switch for opening and closing a circuit. It differs from other switches, which are usually made of copper and plastic parts, insofar as a membrane switch may be printed on a thin sheet(s) of material such as a thermoplastic resin of the polyester family, e.g., polyethylene terephthalate (PET). The ink used for silk screening printing is typically copper/silver/graphite filled and therefore conductive. A membrane switch typically has two to four layers that may include: (1) a first PET layer with a circuit printed thereon; (2) a second layer that acts as a spacer, which can be made of PET; (3) a third PET layer having printed thereon a circuit closer; and (4) a top panel, such as a layer of polyvinyl chloride (PVC), with a button pattern, picture, or some other graphic printed thereon. Membrane switches are typically used in electrical appliances in which the rebouncing feeling may or may not be important. Classic applications for membrane switches includes microwave oven control panels, air conditioner control panels, TV remote controls, etc. The tactile feedback of buttons may be provided by embossing the third PET layer or by embedding metal snap domes.

A typical display creates two difficulties for membrane switch manufacturers. The first is that it is too thick. Membrane switches are by their nature designed to be thin, typically less than 1 millimeter in thickness. Because of this, a display is not generally embedded into the membrane switch but mounted on a PCB that is itself mounted behind the membrane switch. The membrane contains only a cutout or a window to accommodate the display. In instances where an attempt is made to embed the display in the membrane switch, it is typically done by creating a flap cut out from the membrane on three sides, which allows the front surface of the display to remain flush with the front surface of the membrane. This creates several problems, including a potential reliability problem with the printed circuit due to the movement of the flap during processing, which could potentially cause cracks in the electrically conductive traces.

A second difficulty created by the design of the existing displays is that the leads are typically arrayed at the top and bottom edges of the display. While that lead arrangement is easily accommodated in the mainstream PCB industry with traditional soldering techniques, the terminal portions of the leads, or "pads," are typically spaced too close together to reliably dispense adhesive dots for attachment to the conductive ink printed circuits used in the membrane switch industry. While this difficulty can sometimes be solved by screen printing the adhesive, using z axis conductive adhesives, or using proprietary adhesive formulations, all of those techniques create other problems and expenses.

SUMMARY OF THE INVENTION

The present invention solves these two problems by providing an alphanumeric display that is thin and/or can be readily connected with the more cost effective dot dispensing processes common to the membrane switch industry. Displays according to the invention are constructed so they can be produced cost effectively in the wide variety of styles and colors and in the relatively lower volumes required for the membrane switch industry, as compared to the mainstream electronics industry.

The invention encompasses an alphanumeric display that includes a substrate that has a top surface and a bottom surface, a plurality of electrical contacts disposed on the top surface, a plurality of light-emitting electronic devices mounted on the top surface, and a plurality of electrical pads disposed on the bottom surface. The electrical contacts are adapted and arranged to be connected to at least one light-emitting electronic device, and each of the light-emitting electronic devices is electrically connected with corresponding ones of the electrical contacts. The electrical pads are electrically connected with corresponding ones of the electrical contacts for communicating to the light-emitting electronic devices external sources of electrical power and electrical control signals. The electrical pads disposed on the bottom surface are arranged in a pattern to facilitate connections to the device using a conductive adhesive.

The invention further encompasses a display that provides a visual presentation of an alphanumeric character in response to a set of electric signals. The display includes a printed circuit board and a plurality of light-emitting electronic devices. The printed circuit board includes an electrical insulator, a plurality of electrically conductive traces, and a plurality of electrically conductive pads. The electrical insulator includes a first surface, a second surface, and a periphery that bounds the first and second surfaces. The second surface includes a central portion and a border portion, which separates by a margin width the central portion from the periphery. The electrically conductive traces are disposed on the first surface, and the electrically conductive pads are disposed on the second surface. The electrically conductive pads are excluded from the border portion of the second surface and are distributed about the central portion of the second surface such that any two of the plurality of conductive pads are spaced apart by at least twice the margin width. The light-emitting electronic devices are disposed on the first surface and in electrical communication with the electrically conductive traces. Each of the light-emitting electronic devices emit light in response to a respective electric signal of the set of electric signals, and each of the respective electric signals is communicated via a corresponding one of the electrically conductive pads.

The invention further encompasses a printed circuit board that includes an electrical insulator, a plurality of electrically conductive traces, and a plurality of electrically conductive pads. The electrical insulator includes a first surface, a second surface, and a periphery that bounds the first and second surfaces. The periphery includes first and second pairs of parallel edges. The first pair of parallel edges is spaced a first dimension apart and each of the first pair of parallel edges extends a second dimension, and the second pair of parallel edges is spaced the second dimension apart and each of the second pair of parallel edges extends the first dimension. The electrically conductive traces are disposed on the first surface, and the electrically conductive pads are disposed on the second surface. There are precisely nine electrically conductive pads arranged in a pattern of two columns of four electrically conductive pads each, with a single electrically conductive pad disposed between the two columns. Each of the two columns extends parallel to the first pair of parallel edges, and the single electrically conductive pad is disposed half way between the first pair of parallel edges.

BRIEF DESCRIPTION OF THE DRAWINGS

The accompanying drawings, which are incorporated herein and constitute part of this specification, illustrate preferred embodiments of the invention, and together with the general description given above and the detailed description given below, serve to explain features of the invention.

FIG. 1a is a top plan view of a display constructed in accordance with the invention.

FIG. 1b is a side elevation view of the display illustrated in FIG. 1a.

DETAILED DESCRIPTION OF THE PREFERRED EMBODIMENTS

Figures 1A, 1B:
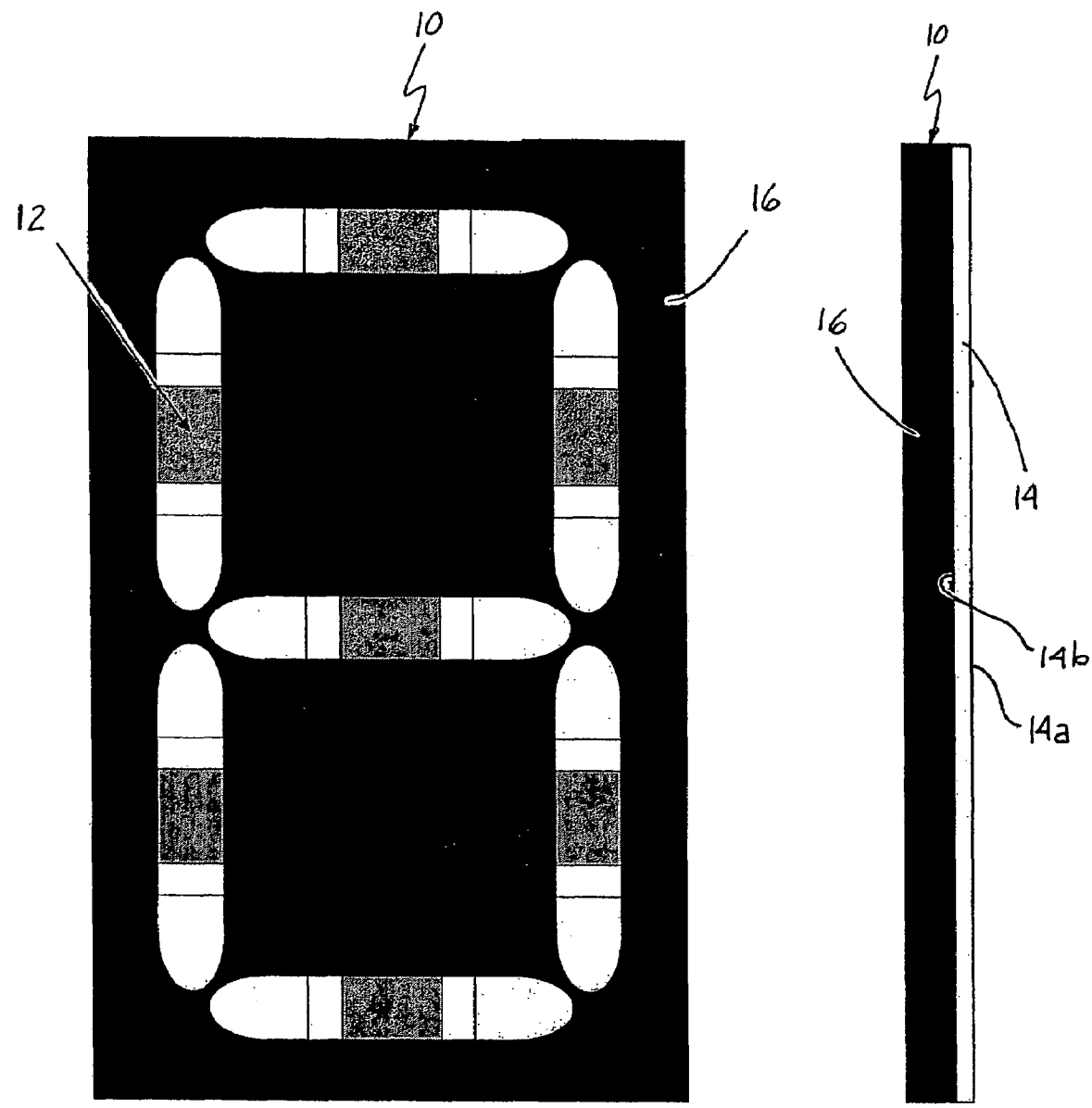

Referring to FIGS. 1a and 1b, an alphanumeric display 10 is shown. The alphanumeric display 10, may be an "eight-segment" display, i.e., seven segments for displaying an alphanumeric character plus an eighth segment for displaying a period or decimal point, or a "seven-segment" display (as shown in FIG. 1a), which is similar to the eight-segment display but omits the segment for displaying the period or decimal point.

A seven-segment display, as its name indicates, is composed of seven segments. The seven segments are arranged as a rectangle of two vertical segments on each side with one horizontal segment on the top and bottom. Additionally, the seventh segment bisects the rectangle horizontally. Often the seven segments are arranged in an oblique, or italic, arrangement, which may aid readability. Individually on or off, the segments can be combined to produce stylized representations of the Hindu-Arabic numerals, i.e., 0-9, or of the Latin alphabet, e.g., A-Z. Of course, stylized representations of other alpha-characters may also be produced.

Typically, seven-segment displays use an array of light-emitting diodes (LEDs), though other types exist using alternative technologies such as cold cathode gas discharge, vacuum fluorescent, incandescent filament, liquid crystal display (LCD), etc. For large signs, e.g., gas price totems, electromagnetically flipped light-reflecting segments may be used. Integrated displays also exist with multiple digits, i.e., with plural individual seven- or eight-segment displays juxtaposed next to one another.

Figure 1C:
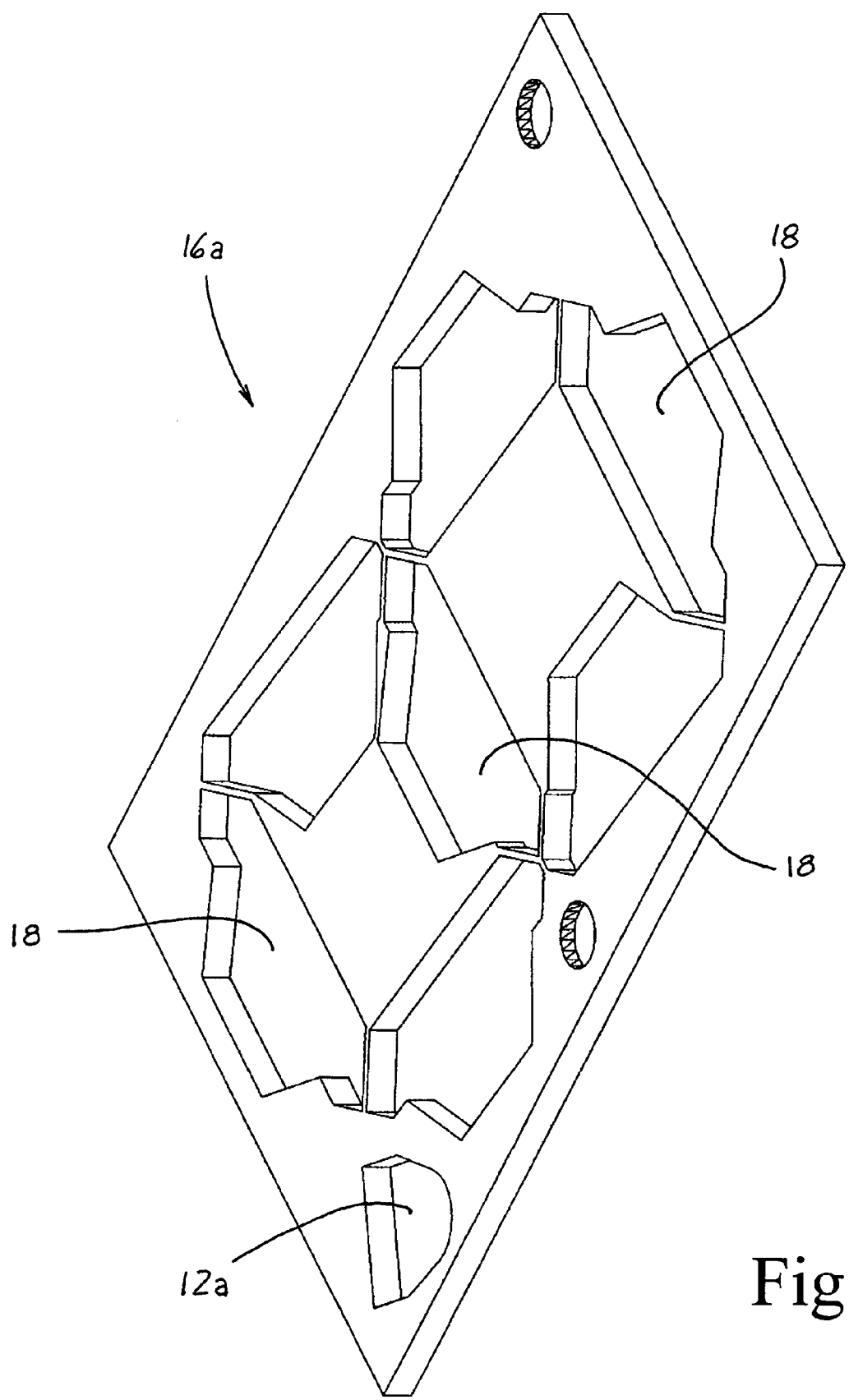
FIG. 1c is a perspective view of a spacer of a display constructed in accordance with the invention.
Figure 1D:
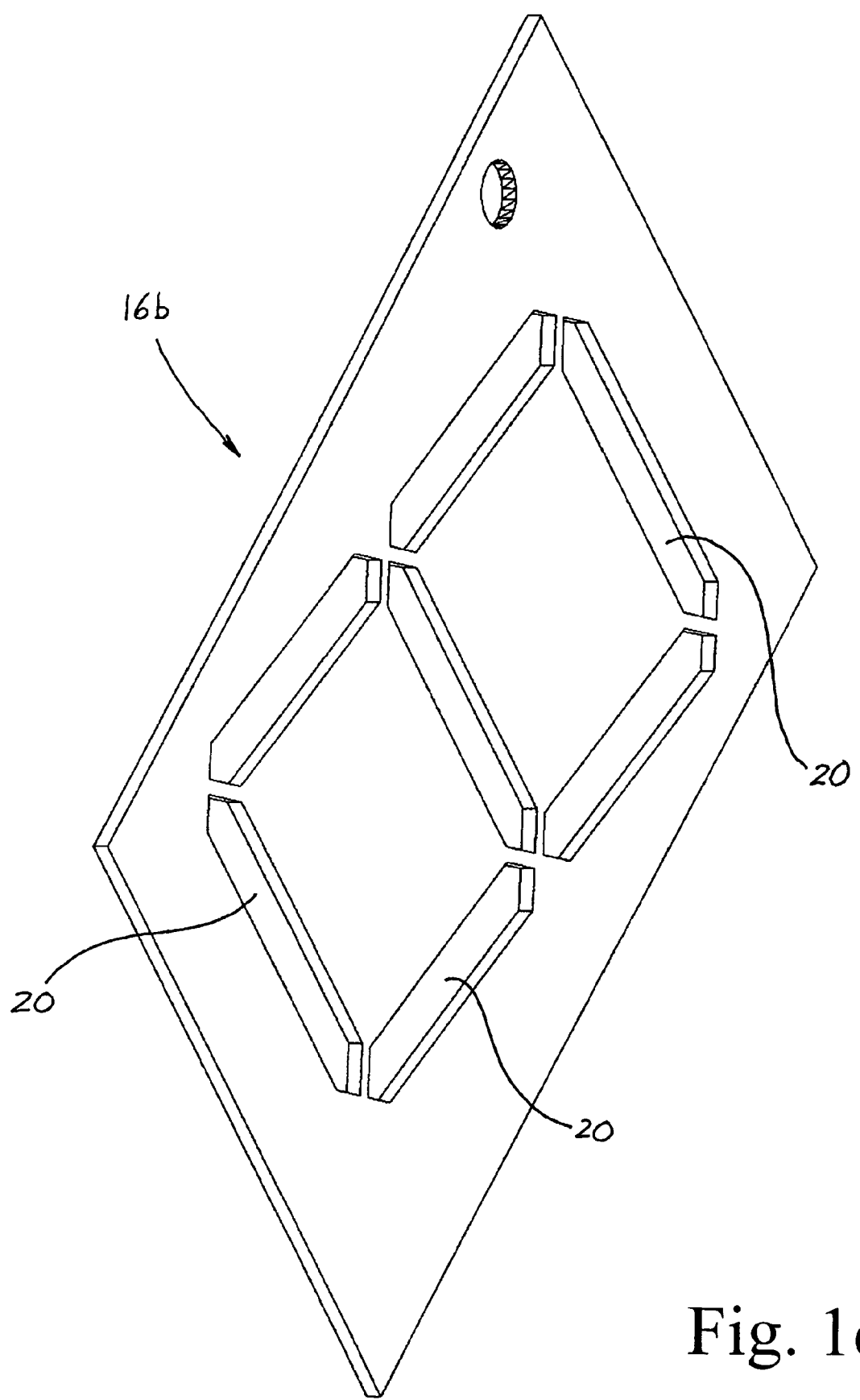
FIG. 1d is a perspective view of an overlay of a display constructed in accordance with the invention.

The alphanumeric display 10, as it is shown in FIGS. 1a, 1b, and 1d, accommodates seven light-emitting electronic devices 12 (only one is indicated in FIG. 1a). FIG. 1c is shown with an additional accommodation 12a for an eighth light-emitting electronic device, e.g., a period or decimal point. Preferably, the alphanumeric display 10 is a laminated construction including a substrate 14 and a cover 16. The substrate 14 is preferably constructed as a sheet from an electrically insulative material, e.g., polyamide or FR4, with a plurality of electrically conductive traces (not shown in FIGS. 1a-1d) disposed on each of its major faces, e.g., bottom surface 14a and top surface 14b. The conductive traces will be described in greater detail hereinafter.

The cover 16 may be constructed as an integral homogenous material, as shown in FIGS. 1a and 1b, or may be a laminated construction of plural layers. For example, as shown in FIGS. 1c and 1d, a spacer 16a and an overlay 16b can be assembled to form cover 16. The spacer 16a and overlay 16b, which may be constructed from the same or different materials, may be assembled by any suitable technique, including adhesive bonding, thermal bonding, welding, separate fasteners (which may additionally secure the substrate 14 to the cover 16), etc.

The cover 16 provides several functions including providing one or more openings 18 (three are indicated) to receive and protect the light-emitting electronic devices 12, and defining the image, e.g., shape, color, etc., of each segment 20 (three are indicated) by transmitting and, preferably, diffusing the light emitted by the light-emitting electronic devices 12. As shown in FIG. 1c, openings 18 may be formed in the spacer 16a, and as shown in FIG. 1d, the segments 20 may be defined by the overlay 16b. Additionally, the cover 16 may provide a form in which a securing and/or diffusing material, e.g., epoxy, may be injected to: (a) mechanically fix the light-emitting electronic devices 12, and/or diffuse the light emitted by the light-emitting electronic devices 12.

Figure 2:
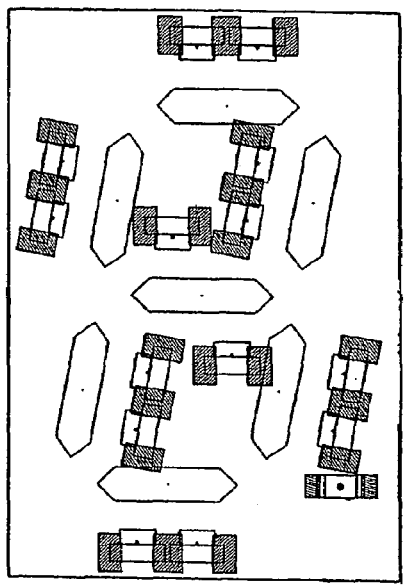
FIG. 2 is a plan view of the top surface of the substrate of a display constructed in accordance with the invention, showing an arrangement of electrical contacts on the top surface adapted and arranged to be connected to light-emitting electronic devices, and showing the light-emitting electronic devices connected thereto.
Figure 3:
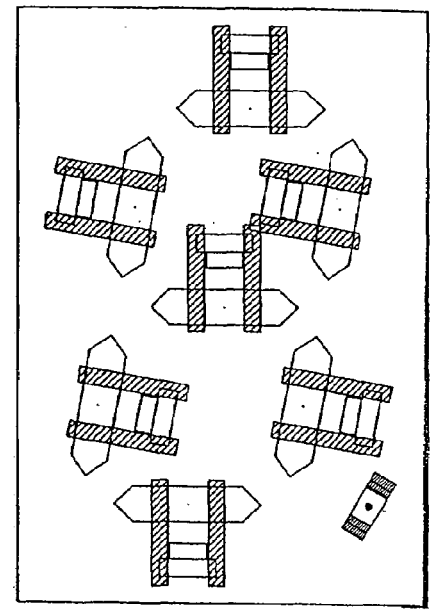
FIG. 3 is a plan view of the top surface of the substrate of a display constructed in accordance with the invention, showing a second arrangement of electrical contacts on the top surface adapted and arranged to be connected to light-emitting electronic devices, and showing the light-emitting electronic devices connected thereto.
Figure 4:
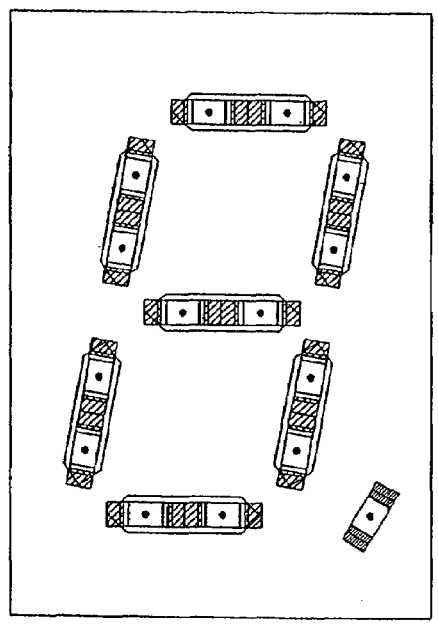
FIG. 4 is a plan view of the top surface of the substrate of a display constructed in accordance with the invention, showing a third arrangement of electrical contacts on the top surface adapted and arranged to be connected to light-emitting electronic devices, and showing the light-emitting electronic devices connected thereto.
Figure 5:
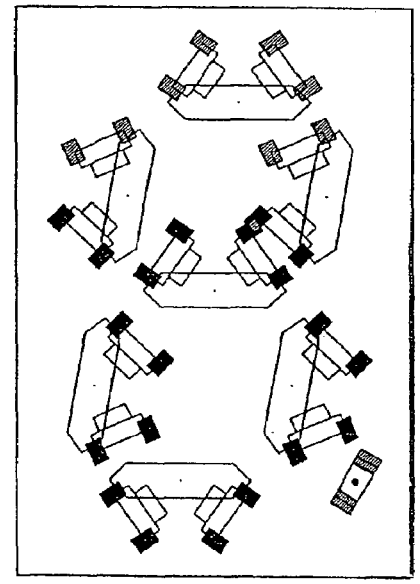
FIG. 5 is a plan view of the top surface of the substrate of a display constructed in accordance with the invention, showing a fourth arrangement of electrical contacts on the top surface adapted and arranged to be connected to light-emitting electronic devices, and showing the light-emitting electronic devices connected thereto.

FIGS. 2-5 show four alternate arrangements of light-emitting electronic devices 12 and corresponding electrical contacts 30 on the top surface 14b of the substrate 14. Superimposed on each arrangement shown in FIGS. 2, 3, and 5 is the image of seven segments 20. The image pattern, which is the same for each arrangement, may be defined by different covers 16 for the respective arrangements of light-emitting electronic devices 12. Alternatively, it may not be necessary for a cover 16 to define the light emitted by the light-emitting electronic devices 12 into the desired image pattern if the light-emitting electronic devices 12 are arranged as shown in FIG. 4. In the case of FIG. 4, the principal responsibilities of cover 16, if one is required, are to protect the light-emitting electronic devices 12 and to distinguish the segments, i.e., to prevent light from bleeding between different segments.

In the arrangement shown in FIG. 2, light for each of the seven character display segments may be provided by pairs of side mounted LEDs. Preferably, each of the fourteen LEDs is 0.070 inches×0.035 inches×0.020 inches. The period or decimal point segment may be a surface mount LED, preferably 0.060 inches×0.030 inches×0.020 inches.

In the arrangement shown in FIG. 3, light for each of the seven character display segments may be provided by single side mounted LEDs. Preferably, each of the seven LEDs is 0.070 inches×0.035 inches×0.020 inches. The period or decimal point segment may be a surface mount LED, preferably 0.060 inches×0.030 inches×0.020 inches.

In the arrangement shown in FIG. 4, light for each of the segments may be provided by single surface mounted LEDs. Preferably, each of the eight LEDs is 0.060 inches×0.030 inches×0.020 inches.

Similar to the arrangement shown in FIG. 2, FIG. 5 also shows that light for each of the seven character display segments may be provided by pairs of side mounted LEDs. However, in the arrangement shown in FIG. 5, the individual LEDs within each pair are oriented obliquely with respect to one another. Preferably, each of the fourteen LEDs is 0.070 inches×0.035 inches×0.020 inches. The period or decimal point segment may be a surface mount LED, preferably 0.060 inches×0.030 inches×0.020 inches.

Of course, the arrangements of light-emitting electronic devices 12 and corresponding electrical contacts 30 on the top surface 14b of the substrate 14 are exemplary of a few preferred embodiments. Other preferred embodiments are also envisioned.

Figure 6:
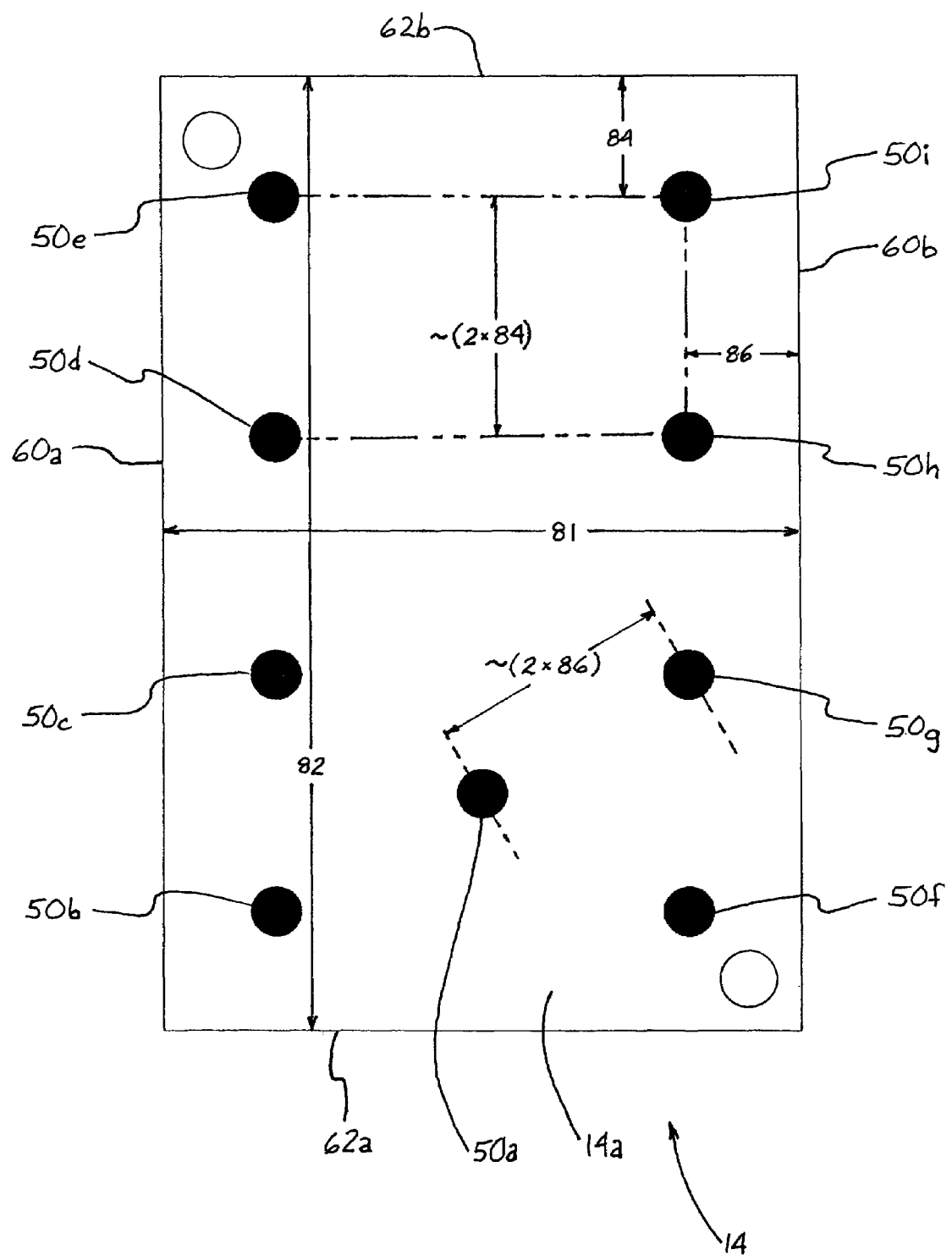
FIG. 6 is a plan view of the bottom surface of the substrate of a display constructed in accordance with the invention, showing an arrangement of electrical pads on the bottom surface for connecting the display to external sources of electrical power and electrical control signals.

Referring now to FIG. 6, a pattern of electrical pads 50 is disposed on the bottom surface 14a of the substrate 14. The electrical pads 50 electrically connect to corresponding ones of the electrical contacts 30 for communicating to the light-emitting electronic devices 12 external sources of electrical power and electrical control signals. Regardless of the arrangement of light-emitting electronic devices 12 and corresponding electrical contacts 30 on the top surface 14b of the substrate 14, the pattern of electrical pads 50 on the bottom surface 14a of the substrate 14 is determined on the basis of maximizing the shortest distance between any two electrical pads 50. Thus, the pattern of electrical pads 50 facilitates making electrical connections to the alphanumeric display 10 using a conductive adhesive. In particular, conductive adhesives may be dispensed as dots for electrically connecting an alphanumeric display 10 to conductive ink printed circuits, e.g., such as used in membrane switches.

Referring again to FIG. 6, a pattern of precisely nine electrical pads 50a-50i on the bottom surface 14a of the substrate 14 provides (1) a single electrically conductive pad 50a that is electrically connected in common to each of the light-emitting electronic devices 12 in an eight-segment alphanumeric display 10, and (2) individual electrically conductive pads 50b-50i separately connected to a respective one of the eight light-emitting electronic devices 12. If, however, a seven-segment alphanumeric display was used in place of the eight-segment alphanumeric display 10, there would be precisely eight electrical pads, i.e., one common electrical pad and seven individual electrical pads.

Preferably, the common electrically conductive pad 50a is disposed along a longitudinal centerline on the bottom surface 14a of the substrate 14, and the eight individual electric pads 50b-50i are arranged in a first column of four electrically conductive pads 50b-50e and a second column of four electrically conductive pads 50f-50i, with the common electrically conductive pad 50a disposed between the two columns. Each of the two columns extends parallel to a first pair of parallel edges 60a,60b. The two columns of electrically conductive pads therefore define a stack of four pairs of electrically conductive pads. The first pair of electrically conductive pads 50b,50f, the second pair of electrically conductive pads 50c,50g, the third pair of electrically conductive pads 50d, 50h, and the fourth pair of electrically conductive pads 50d, 50i each extend parallel to a second pair of parallel edges 62a,62b. Preferably, the common pad 50a is disposed approximately half-way between the first pair of parallel edges 60a,60b and either between the first and second pairs of electrically conductive pads 50b,50f and 50c,50g (i.e., the two pairs proximate edge 62a, as shown in FIG. 6), or between the third and fourth pairs of electrically conductive pads 50d,50h and 50d,50i (i.e., the two pairs proximate edge 62b). Alternatively, the common pad 50a may be disposed approximately half-way between the first pair of parallel edges 60a,60b, and between the second and third pairs of electrically conductive pads 50c,50g and 50d,50h (i.e., approximately half-way between the second pair of parallel edges 62a,62b).

In order to maximize the shortest distance between any two electrically conductive pads 50a-50i, the electrically conductive pads 50 must be arranged with respect to each other and with respect to the first and second sets of parallel edges 60a,60b and 62a,62b, respectively. With respect to the latter, the object is to maximize the shortest distance between any two electrically conductive pads 50 of juxtaposed alphanumeric displays 10. Additionally, there may be a gap between adjacent juxtaposed alphanumeric displays 10, e.g., the first parallel edge 60a of a first alphanumeric display 10 is spaced apart from the first parallel edge 60b of a juxtaposed second alphanumeric display 10.

A periphery of the alphanumeric displays 10 is defined by the first and second sets of parallel edges 60a,60b and 62a, 62b. The first pair of parallel edges 60a,60b is spaced apart a first dimension 81 and each of the first pair of parallel edges 60a,60b extends a second dimension 82. Consequently, because the alphanumeric displays 10 is preferably a parallelogram, and more preferably a rectangle, the second pair of parallel edges 62a,62b is spaced apart the second dimension 82 and each of the second pair of parallel edges 62a,62b extends the first dimension 81. As it is used herein, "periphery" is defined as the set of edges that bound the bottom and top surfaces 14a,14b of the substrate 14.

Thus, in order to maximize the shortest distance between any two electrically conductive pads 50 of a single alphanumeric pad 10 or of juxtaposed alphanumeric displays 10, the first and second columns of electrically conductive pads 50b-50e and 50f-50i, respectively, each are disposed inboard a first distance 84 from each of the second pair of parallel edges 62a,62b, and the four electrically conductive pads 50b-50e and 50f-50i of each of the two columns are preferably spaced apart substantially equidistant and approximately twice the first distance 84. Additionally, each of the two columns is disposed inboard a second distance 86 from a respective one of the first pair of parallel edges 60a,60b, and the common electrically conductive pad 50a is preferably spaced not less than approximately twice the second distance 86 from any of the electrically conductive pads 50b-50i.

Consequently, the electrically conductive pads 50a-50i are all disposed about a central portion of the bottom side 14a, i.e., a border portion of the bottom surface 14a provides a margin having a width defined by the first and second distances 84,86, which separates the central portion from the periphery of the substrate 14. The electrically conductive pads 50a-50i are excluded from being disposed in the border portion of the bottom surface 14a.

An exemplary pattern of electrical pads 50 according to a preferred embodiment may be described by the following set of characteristics:

TABLE 1

| CHARACTERISTIC | QUANTITY (inches) |
|---|---|
| first dimension 81 | 0.480 |
| second dimension 82 | 0.750 |
| first distance 84 | 0.094 |
| spacing between two adjacent pairs of conducting pads; i.e., approximately twice the first distance 84 | 0.188 |
| second distance 86 | 0.082 |
| spacing between common electrically conductive pad 50a and any of electrically conductive pads 50b-50i; i.e., approximately twice the second distance 86 | 0.184 |
| spacing of common electrically conductive pad 50a from either of the first pair of parallel edges 60a, 60b | 0.240 |
| spacing of common electrically conductive pad 50a from the parallel edges 62a | 0.188 |
| spacing of common electrically conductive pad 50a from the parallel edges 62b | 0.563 |
| diameter of electrically conductive pad | 0.040 |

The distances and spacings described in Table 1 are measured with respect to the center points of the electrically conductive pads. The tolerance of a Quantity in Table 1, e.g., a Characteristic in Table 1 that is described by the term "approximately," is ±12% and is preferably ±6%.

Figure 7:
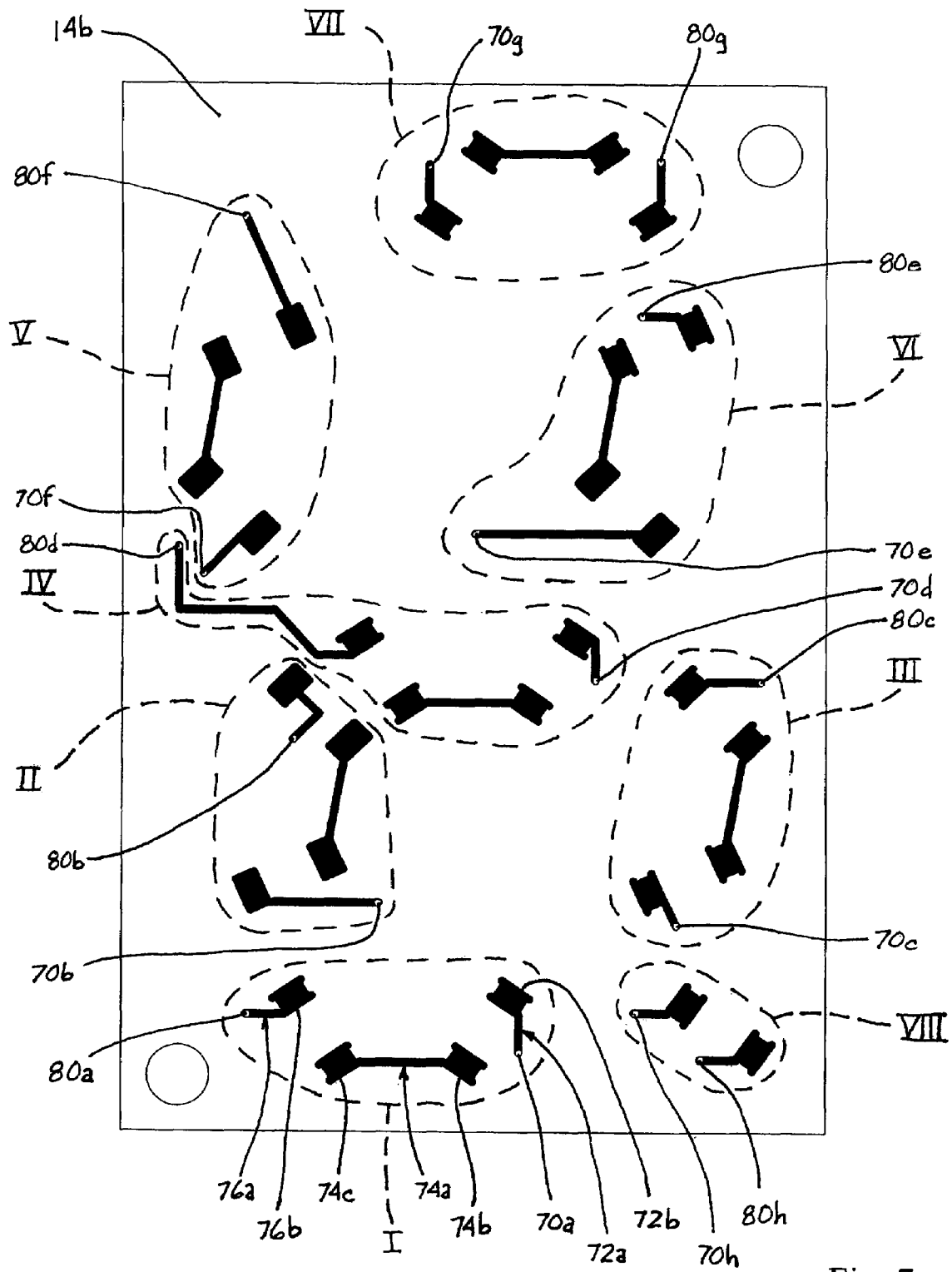
FIG. 7 is a plan view of the top surface of the substrate of a display constructed in accordance with the invention, showing the fourth arrangement of electrical contacts as illustrated in FIG. 5.
Figure 8:
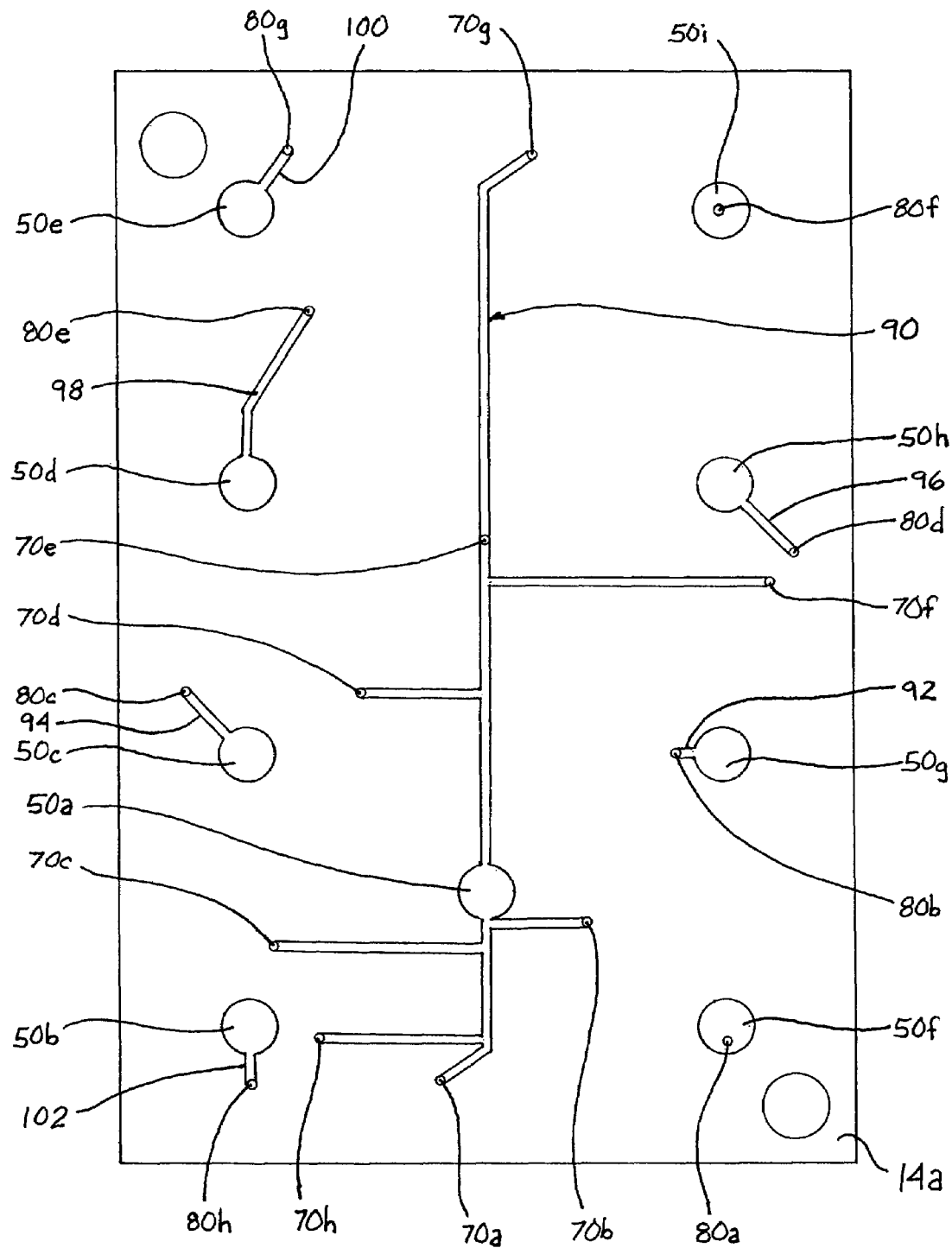
FIG. 8 is a plan view of the bottom surface of the substrate that corresponds to the top surface illustrated in FIG. 7, showing an arrangement of electrical pads on the bottom surface similar to FIG. 6, and showing a first configuration of traces and vias for connecting the display to external sources of electrical power and electrical control signals.

Referring now to FIGS. 7 and 8, a preferred pattern of conductive traces on the top surface 14b (FIG. 7) and bottom surface 14a (FIG. 8) of a substrate will now be described. The conductive traces of FIGS. 7 and 8 are shown with respect to an arrangement of light-emitting electronic devices as shown in FIG. 5. Of course, any of the other exemplary arrangements, or an entirely different arrangement of light-emitting electronic devices 12, could alternately be used.

FIG. 7 shows a plurality of electrical contacts that may be separated into eight sets I-VIII. Each of the sets I-VIII facilitates the electrical connections to the light-emitting electronic device(s) that emit the light for a corresponding segment of alphanumeric display 10. The sets I-VII correspond to the segments of the alphanumeric character, and set VIII corresponds to the segment for the period or decimal point. Each of the electrical contacts provides a coupling area for establishing by any known technique, e.g., soldering, an electrical communication with a respective light-emitting electronic device.

For the sake of clarity, only set I of the electrical contacts will be described in detail. Sets II-VII could be similarly described. An electrical source of power is communicated to set VII by a via 70a. A first conductive trace 72a electrically couples the via 70a to an electrical contact 72b suitable for providing an electrical connection to a first end of a first light-emitting electronic device 12 (not shown in FIG. 7). A second conductive trace 74a electrically couples an electrical contact 74b suitable for providing an electrical connection to a second end of the first light-emitting electronic device 12 to an electrical contact 74c suitable for providing an electrical connection a first end of a second light-emitting electronic device 12 (not shown in FIG. 7). A third conductive trace 76a electrically couples an electrical contact 76b suitable for providing an electrical connection with a second end of the second light-emitting electronic device to a via 80a. The via 80a communicates with an electrical control signal for the set VII.

Set VIII differs from sets I-VII only in that there is a single light-emitting electronic device 12 (not shown in FIG. 7); thus there is one less trace associated with set VIII as compared with sets I-VII.

For each set I-VIII, there is a corresponding via 70a-70h, respectively, for communicating with an electrical source of power, and a corresponding via 80a-80h, respectively, for communicating with an electrical control signal. Of course, a set of light-emitting electronic device(s) is activated when an electric control signal completes a circuit including the electrical source of power.

Referring now to FIG. 8, the vias, which are holes providing electrically coupling between the bottom and top surfaces 14a,14b of the substrate 14, are shown with respect to the bottom surface 14a. Vias 70a-70h are all shown electrically coupled by a common trace 90 with the common electrically conductive pad 50a. Via 80a is directly electrically coupled with electrical pad 50f; via 80b is electrically coupled with electrical pad 50g by a trace 92; via 80c is electrically coupled with electrical pad 50c by a trace 94; via 80d is electrically coupled with electrical pad 50h by a trace 96; via 80e is electrically coupled with electrical pad 50d by a trace 98; via 80f is directly electrically coupled with electrical pad 50i; via 80g is electrically coupled with electrical pad 50e by a trace 100; and via 80h is electrically coupled with electrical pad 50b by a trace 102.

Figure 9:
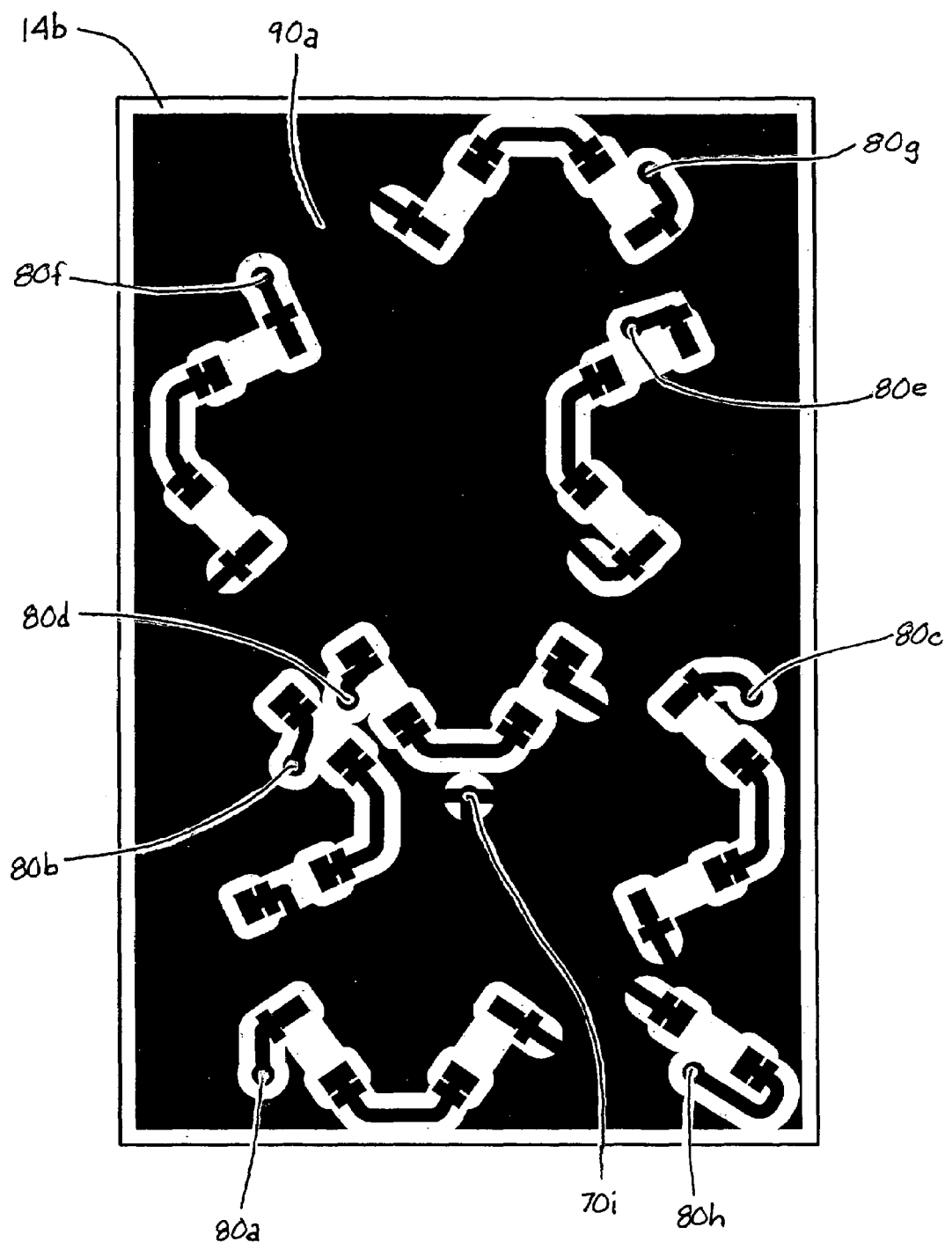
FIG. 9 is a plan view of the top surface of the substrate of a display constructed in accordance with the invention, showing the fourth arrangement of electrical contacts as illustrated in FIG. 5, and showing a reflector on the top surface.
Figure 10:
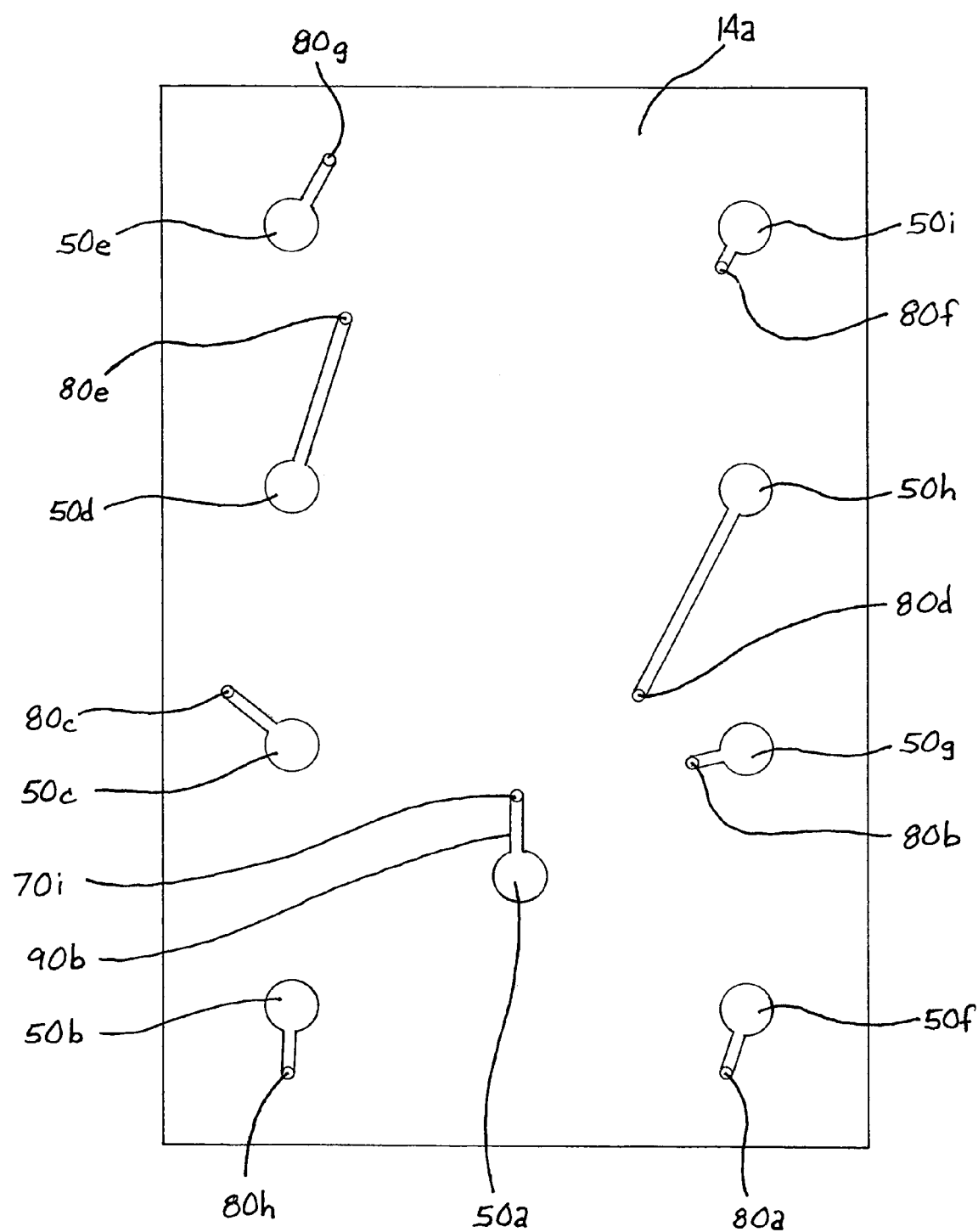
FIG. 10 is a plan view of the bottom surface of the substrate that corresponds to the top surface illustrated in FIG. 9, showing an arrangement of electrical pads on the bottom surface similar to FIG. 6, and showing a second configuration of traces and vias for connecting the display to external sources of electrical power and electrical control signals.

Referring now to FIGS. 9 and 10, a preferred pattern of conductive traces on the top surface 14b (FIG. 9) and bottom surface 14a (FIG. 10) of a substrate will now be described. The conductive traces of FIGS. 9 and 10, like those of FIGS. 7 and 8, are shown with respect to an arrangement of light-emitting electronic devices as shown in FIG. 5. Of course, any of the other exemplary arrangements, or an entirely different arrangement of light-emitting electronic devices 12, could alternately be used.

FIGS. 9 and 10 differ from FIGS. 7 and 8, respectively, with regard to at least two features. First, a reflector is provided on the top surface 14b. The reflector serves to reflect light emitted by the light-emitting electronic devices (now shown in FIG. 9) toward the cover 16 of the alphanumeric display 10. Preferably, the reflector is made of the same material and formed concurrently with the electrically conductive traces on the top surface 14b. For example, the reflector and the electrically conductive traces may be made of tin plated copper material that is deposited on the substrate 14 and then etched so as to form the reflector and the electrically conductive traces. The second feature is that the reflector may also provide a majority 90a of the common trace, which was primarily formed on the bottom surface 14a in the embodiment of FIGS. 7 and 8. Thus, a correlary of the second feature is that the patterns of electrically conductive traces on the bottom and top surfaces 14a, 14b may be simplified by virtue of a minority 90b of the common trace being formed on the bottom surface 14a. The minority 90b is connected to the majority 90a by an additional via 70i.

Thus, a feature of the invention is a substrate in the form of a double-sided PCB with electrical contacts, or mounting pads, on the top surface, adapted and arranged to accept at least one light-emitting electronic device, such as an LED. The mounting pads are adapted and arranged to accept a variety of standard LED styles, including wire bonded LED chips, as in a conventional display construction.

Another feature of the invention is a plurality of pads distributed evenly on the bottom surface of the PCB for connection to the printed conductive circuit.

Another feature of the invention is that, on the top surface, LEDs, either standard surface mount, side mount, or wire-bonded LEDs, are mounted to the PCB and connected to the mounting pads. A spacer is applied over the top surface to protect the LEDs. The spacer has at least one opening, and typically will have several openings, which permit light generated by the LEDs to pass through the spacer, and which define the display segments. According to a further feature of the invention, material can be added to fill the openings to help diffuse the light emitted by the LEDs, or an overlay may be used within the openings to help diffuse the light. In yet a further feature of the invention, a membrane switch overlay may also help diffuse the light.

Another feature of the invention is that the evenly spaced pads on the bottom of the PCB allow for a maximum amount of room between the pads to enable dot dispensing of a conductive adhesive to be accomplished easily and cost effectively.

Another feature of the invention is that the same material and process used to form the electrically conductive traces may also be used to provide on the top surface of the PCB a reflector for reflecting toward the cover light that is emitted by the LEDs.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

What is claimed is:

1. A display providing a visual presentation of an alphanumeric character in response to a set of electric signals, the display comprising:

a printed circuit board including:
an electrical insulator including a first surface, a second surface, and a periphery bounding the first and second surfaces, the second surface including a central portion and a border portion, the border portion separating by a margin width the central portion from the periphery;
a plurality of electrically conductive traces disposed on the first surface; and
a plurality of electrically conductive pads disposed on the second surface, the plurality of electrically conductive pads being excluded from the border portion of the second surface and being distributed about the central portion of the second surface such that any two of the plurality of conductive pads are spaced apart by at least approximately twice the margin width;
a plurality of light-emitting electronic devices disposed on the first surface and in electrical communication with the plurality of electrically conductive traces, each of the plurality of light-emitting electronic devices emitting light in response to a respective electric signal of the set of electric signals, and each of the respective electric signals being communicated via a corresponding one of the plurality of electrically conductive pads;
wherein the periphery of the electrical insulator comprises first and second pairs of parallel edges, the first pair of parallel edges being spaced a first dimension apart and each of the first pair of parallel edges extending a second dimension, and the second pair of parallel edges is spaced the second dimension apart and each of the second pair of parallel edges extends the first dimension;
wherein the plurality of electrically conductive pads consists of nine electrically conductive pads arranged in a pattern of two columns of four electrically conductive pads each and a single pad disposed between the two columns, each of the two columns extending parallel to the first pair of parallel edges, the two columns of four electrically conductive pads defining a stack of four pairs of electrically conductive pads, each of the four pairs extending parallel to the second pair of parallel edges, and the single pad being disposed approximately halfway between the first pair of parallel edges and between two adjacent pairs of electrically conductive pads located proximate either of the second pair of parallel edges; and
wherein the plurality of light-emitting electronic devices consists of eight light-emitting diodes.

2. The display according to claim 1, further comprising:
a covering fixed to the first surface, the covering including a spacer and an overlay, the spacer including openings receiving the eight light-emitting diodes and being disposed between the first surface and the overlay, and the overlay defining segments of the alphanumeric character and transmitting light emitted by the eight light-emitting diodes; and
a reflector disposed on the first surface and separated from the nine electrically conductive traces, the reflector and the nine electrically conductive traces including tin-plated copper.

* * * * *